United States Patent
Chen et al.

(10) Patent No.: US 10,211,791 B2
(45) Date of Patent: Feb. 19, 2019

(54) HYBRID RF TRANSCEIVER CIRCUIT

(71) Applicant: GEAR RADIO ELECTRONICS CORP., Hsinchu (TW)

(72) Inventors: Min-Chiao Chen, Kaohsiung (TW); Tao-Yi Lee, Taichung (TW)

(73) Assignee: GEAR RADIO ELECTRONICS CORP., Hsinchu (TW)

( * ) Notice: Subject to any disclaimer, the term of this patent is extended or adjusted under 35 U.S.C. 154(b) by 3 days.

(21) Appl. No.: 15/702,321

(22) Filed: Sep. 12, 2017

(65) Prior Publication Data
US 2018/0351517 A1    Dec. 6, 2018

Related U.S. Application Data

(60) Provisional application No. 62/514,063, filed on Jun. 2, 2017.

(51) Int. Cl.
| | |
|---|---|
| *H03F 1/56* | (2006.01) |
| *H03F 3/24* | (2006.01) |
| *H04B 1/40* | (2015.01) |
| *H03F 3/189* | (2006.01) |

(52) U.S. Cl.
CPC ............ *H03F 1/565* (2013.01); *H03F 3/189* (2013.01); *H03F 3/245* (2013.01); *H03F 2200/09* (2013.01); *H03F 2200/294* (2013.01); *H03F 2200/318* (2013.01); *H03F 2200/387* (2013.01); *H03F 2200/411* (2013.01); *H03F 2200/451* (2013.01); *H04B 1/40* (2013.01)

(58) Field of Classification Search
CPC .......... H03F 1/565; H03F 3/189; H03F 3/245; H03F 2200/294; H03F 2200/09; H03F 2200/318; H03F 2200/387; H03F 2200/411; H03F 2200/451; H04B 1/40
USPC ......................................................... 333/124
See application file for complete search history.

(56) References Cited

U.S. PATENT DOCUMENTS

| | | | |
|---|---|---|---|
| 2,210,028 A | 8/1940 | Doherty | |
| 8,710,924 B2 | 4/2014 | Zanden et al. | |
| 9,374,051 B2 | 6/2016 | Ahmed et al. | |
| 9,438,173 B2 | 9/2016 | Murao | |
| 2012/0295556 A1* | 11/2012 | Chien | H03F 1/56 455/78 |
| 2013/0095895 A1* | 4/2013 | Asuri | H04B 1/0064 455/571 |

* cited by examiner

*Primary Examiner* — Robert J Pascal
*Assistant Examiner* — Kimberly E Glenn
(74) *Attorney, Agent, or Firm* — Innovation Capital Law Group, LLP; Vic Lin

(57) ABSTRACT

A hybrid RF transceiver circuit comprises a first matching network, a second matching network, a first power amplifier, a second power amplifier, and a low noise amplifier. The second matching network is coupled to the first matching network and an antenna. An output port of the first power amplifier is coupled to the first matching network and the second matching network. The output port of the second power amplifier is coupled to the first matching network. The input port of the low noise amplifier is coupled to the second power amplifier and the first matching network. The output port of the low noise amplifier is coupled to a receiver circuit.

24 Claims, 13 Drawing Sheets

HYBRID RF TRANSCEIVER CIRCUIT

This application claims the benefit of U.S. provisional application Ser. No. 62/514,063, filed Jun. 2, 2017, the disclosure of which is incorporated by reference herein in its entirety.

BACKGROUND OF THE INVENTION

Field of the Invention

The invention relates to a hybrid RF transceiver circuit.

Description of the Related Art

Wireless communication is an important way for modern people to deliver information. In general, a wireless communication system in order to deliver information to a far area, delivering through a radio frequency is an effective means. Thus, radio frequency (RF) transceivers play a pivotal role in the wireless communication systems.

Based on the importance of RF transceivers in wireless communication systems, how to improve the efficiency of RF transceivers has been one of the most widely studied topics in the field of wireless communication.

SUMMARY OF THE INVENTION

A hybrid RF transceiver circuit is disclosed in the present invention to improve the efficiency of RF transceivers.

A hybrid RF transceiver circuit comprises a first matching network having a first port and a second port, a second matching network having a first port and a second port, a first power amplifier having an input port and an output port, a second power amplifier having an input port and an output port, and a low noise amplifier having an input port and an output port. The first port of the second matching network is coupled to the second port of the first matching network. The second port of the second matching network is used to be coupled to an antenna. The output port of the first power amplifier is coupled to the second port of the first matching network and the first port of the second matching network. The output port of the second power amplifier is coupled to the first port of the first matching network. The input port of the low noise amplifier is coupled to the output port of the second power amplifier and the first port of the first matching network. The output port of the low noise amplifier is configured to be coupled to a receiver circuit.

A hybrid RF transceiver circuit comprises a first matching network having a first port and a second port, a second matching network having a first port and a second port, a first power amplifier having an input port and an output port, a second power amplifier having an input port and an output port, and a low noise amplifier having an input port and an output port. The first port of the second matching network is coupled to the second port of the first matching network. The second port of the second matching network is used to be coupled to an antenna. The output port of the first power amplifier is coupled to the second port of the first matching network and the first port of the second matching network. The output port of the second power amplifier is coupled to the first port of the first matching network. The input port of the low noise amplifier is coupled to the second port of the first matching network and the first port of the second matching network. The output port of the low noise amplifier is configured to be coupled to a receiver circuit.

A hybrid RF transceiver circuit comprises a first matching network having a first port and a second port, a second matching network having a first port and a second port, a first power amplifier having an input port and an output port, a second power amplifier having an input port and an output port, and a low noise amplifier having an input port and an output port. The first port of the second matching network is coupled to the second port of the first matching network. The second port of the second matching network is used to be coupled to an antenna. The output port of the first power amplifier is coupled to the second port of the first matching network and the first port of the second matching network. The output port of the second power amplifier is coupled to the first port of the first matching network. The input port of the low noise amplifier is coupled to the second port of the second matching network. The output port of the low noise amplifier is configured to be coupled to a receiver circuit.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
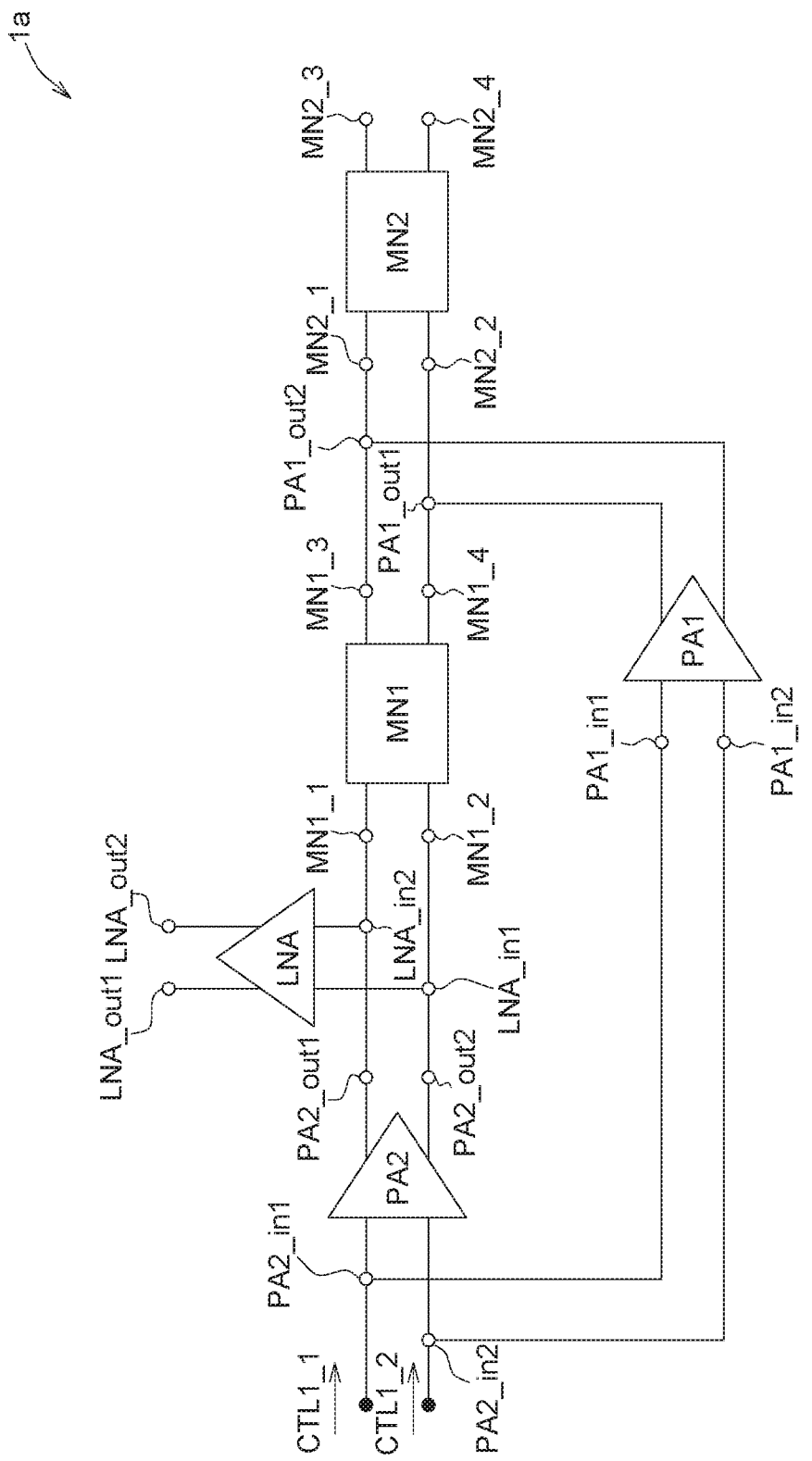
FIG. 1 shows a block diagram of a hybrid RF transceiver circuit according to the 1st embodiment of the present invention.

Referring to FIG. 1, FIG. 1 shows a block diagram of a hybrid RF transceiver circuit according to the 1st embodiment of the present invention. Hybrid RF transceiver circuit 1a includes a first power amplifier PA1, a second power amplifier PA2, a low noise amplifier LNA, a first matching network MN1 and a second matching network MN2. The hybrid RF transceiver circuit 1a may be a part of circuits in a hybrid RF transceiver, which is used to transmit/receive radio frequency (RF) signal.

The first power amplifier PA1 has an input port PA1_in1, PA1_in2 and an output port PA1_out1, PA1_out2. The second power amplifier PA2 has an input port PA2_in1, PA2_in2 and an output port PA2_out1, PA2_out2. The low noise amplifier LNA has an input port LNA_in1, LNA_in2 and an output port LNA_out1, LNA_out2. The first matching network MN1 has a first port MN1_1, MN1_2 and a second port MN1_3, MN1_4. The second matching network MN2 has a first port MN2_1, MN2_2 and a second port MN2_3, MN2_4.

The input port PA1_in1, PA1_in2 of the first power amplifier PA1 is used to receive a first RF input signal RFin1_1, RFin1_2 from a first operating circuit (not shown). The first RF input signal RFin1_1, RFin1_2 may be used to operate the first power amplifier PA1 to turn on or off. The output port PA1_out1, PA1_out2 of the first power amplifier PA1 is coupled to the second port MN1_3, MN1_4 of the first matching network and the first port MN2_1, MN2_2 of the second matching network MN2.

The input port PA2_in1, PA2_in2 of the second power amplifier PA2 is coupled to the input port PA1_in1, PA1_in2 of the first power amplifier PA1. The input port PA2_in1, PA2_in2 of the second power amplifier PA2 is used to receive the first RF input signal RFin1_1, RFin1_2 from the first operating circuit (not shown). That is, the first power amplifier PA1 and the second power amplifier PA2 share the first RF input signal RFin1_1, RFin1_2. The first RF input signal RFin1_1, RFin1_2 may be used to operate the second power amplifier PA2 to turn on or off. The output port PA2_out1, PA2_out2 of the second power amplifier PA2 is coupled to the first port MN1_1, MN1_2 of the first matching network.

The first port MN1_1, MN1_2 of the first matching network MN1 is coupled to the output port PA2_out1, PA2_out2 of the second power amplifier PA2. The second port MN1_3, MN1_4 of the first matching network MN1 is coupled to the first port MN2_1, MN2_2 of the second matching network MN2.

The first port MN2_1, MN2_2 of the second matching network MN2 is coupled to the second port MN1_3, MN1_4 of the first matching network MN1. The second port MN2_3, MN2_4 of the second matching network MN2 is used to be coupled to an antenna (not shown).

The input port LNA_in1, LNA_in2 of the low noise amplifier LNA is coupled to the output port PA1_out1, PA1_out2 of the first power amplifier PA1 and the first port MN1_1, MN1_2 of the first matching network MN1. The output port LNA_out1, LNA_out2 of the low noise amplifier LNA is used to be coupled to a receiver circuit (not shown).

In 1st embodiment, the hybrid RF transceiver circuit 1a is a circuit having three RF ports. The first RF port of the hybrid RF transceiver circuit 1a is the output port LNA_out1, LNA_out2 of the low noise amplifier LNA, which is used to be coupled to the receiver circuit. The second RF port of the hybrid RF transceiver circuit 1a is the second port MN2_3, MN2_4 of the second matching network MN2, which is used to be coupled to the antenna. The third RF port of the hybrid RF transceiver circuit 1a is the input port PA1_in1, PA1_in2 of the first power amplifier PA1 and the input port PA2_in1, PA2_in2 of the second power amplifier PA2, which is used to receive the first RF input signal RFin1_1, RFin1_2.

Figure 2:
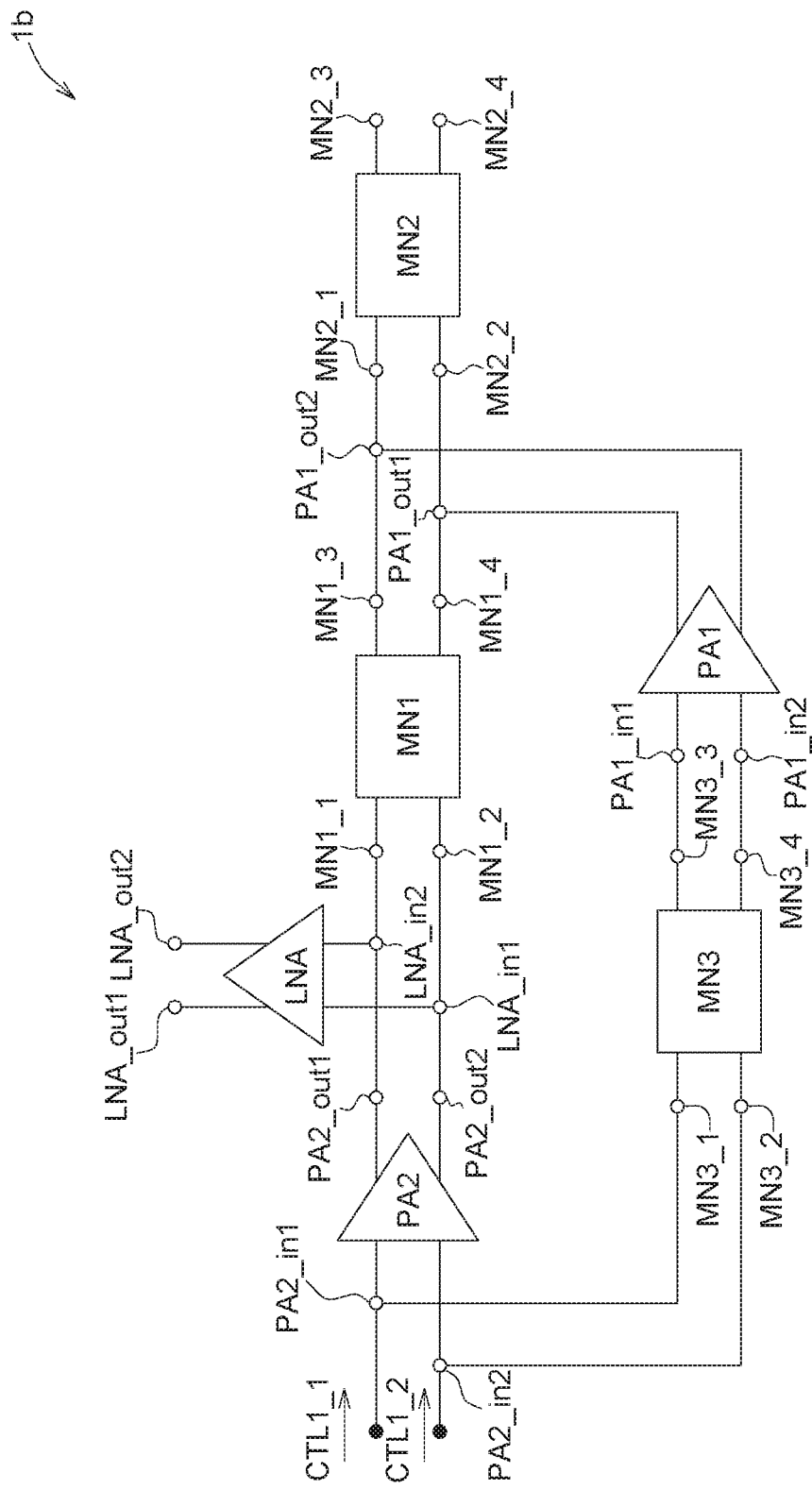
FIG. 2 shows a block diagram of a hybrid RF transceiver circuit according to the 2nd embodiment of the present invention.

Referring to FIG. 2, FIG. 2 shows a block diagram of a hybrid RF transceiver circuit according to the 2nd embodiment of the present invention. Hybrid RF transceiver circuit 1b is similar to the hybrid RF transceiver circuit 1a. The differences are that the hybrid RF transceiver circuit 1b further includes a third matching network MN3, and the second power amplifier PA2 is coupled to the first power amplifier PA1 through the third matching network MN3.

The third matching network MN3 includes a first port MN3_1, MN3_2 and a second port MN3_3, MN3_4. The first port MN3_1, MN3_2 of the third matching network MN3 is coupled to the input port PA2_in1, PA2_in2 of the second power amplifier PA2. The second port MN3_3, MN3_4 of the third matching network MN3 is coupled to the input port PA1_in1, PA1_in2 of the first power amplifier PA1. That is, the first power amplifier PA1 receives the first RF input signal RFin1_1, RFin1_2 from the first operating circuit through the third matching network MN3.

In 2nd embodiment, the third port of the hybrid RF transceiver circuit 1b is not the input port PA1_in1, PA1_in2 of the first power amplifier PA1 (and the input port PA2_in1, PA2_in2 of the second power amplifier PA2), but the first port MN3_1, MN3_2 of the third matching network MN3 (and the input port PA2_in1, PA2_in2 of the second power amplifier PA2).

Figure 3:
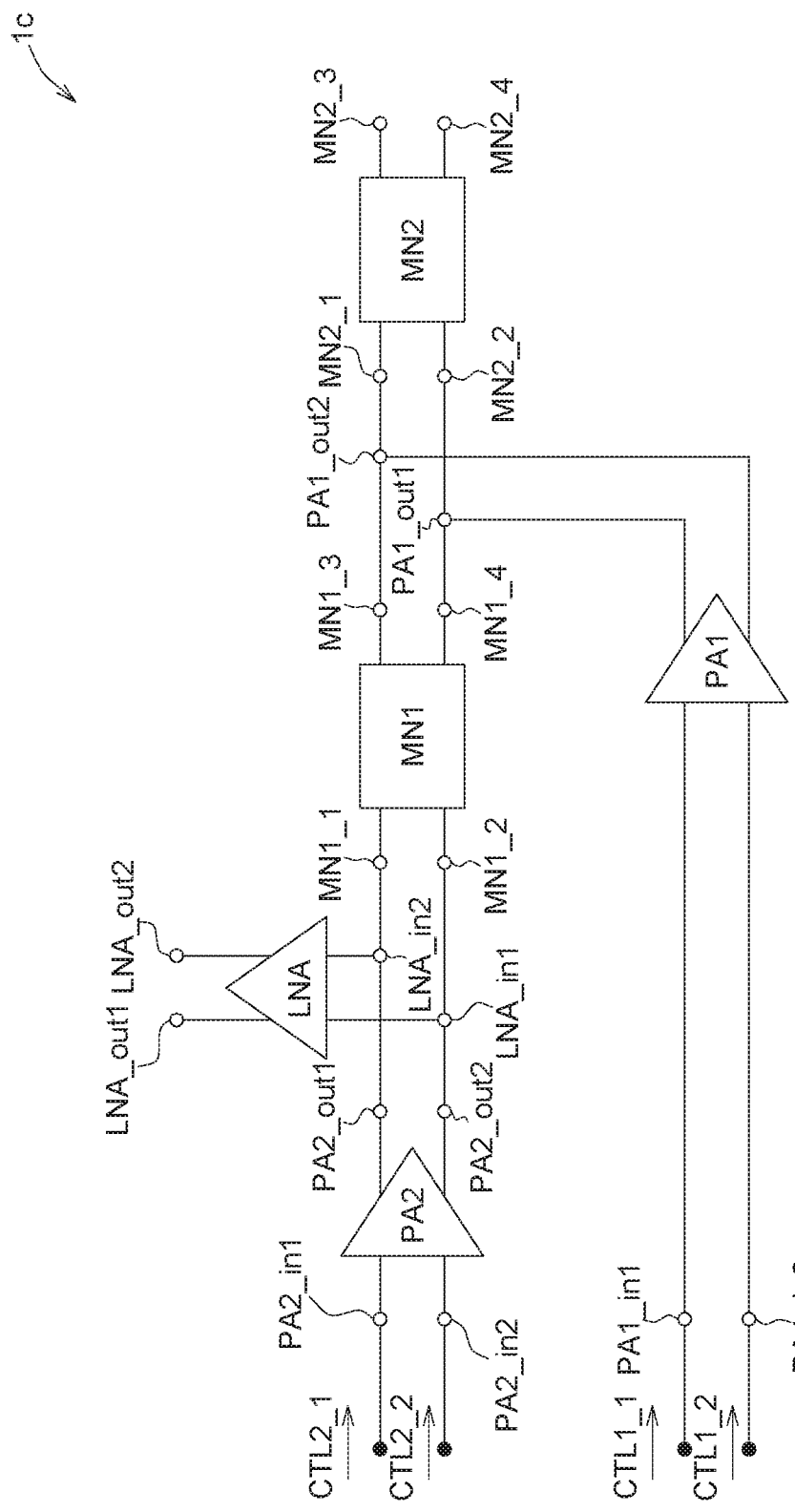
FIG. 3 shows a block diagram of a hybrid RF transceiver circuit according to the 3rd embodiment of the present invention.

Referring to FIG. 3, FIG. 3 shows a block diagram of a hybrid RF transceiver circuit according to the 3rd embodiment of the present invention. Hybrid RF transceiver circuit 1c is similar to the hybrid RF transceiver circuit 1a. The difference is that the input port PA2_in1, PA2_in2 of the second power amplifier PA2 is not coupled to the input port PA1_in1, PA1_in2 of the first power amplifier PA1 in hybrid RF transceiver circuit 1c.

In 3rd embodiment, the third port of the hybrid RF transceiver circuit 1c is a circuit having four RF ports. The input port PA2_in1, PA2_in2 is configured as a fourth RF port (rather than the third RF port) of the hybrid RF transceiver circuit 1c to receive second RF input signal RFin2_1, RFin2_1 from a second operating circuit (not shown). In the 3rd embodiment, due to the first RF input signal RFin1_1, RFin1_2 and the second RF input signal RFin2_1, RFin2_2 may operate the first power amplifier PA1 and the second power amplifier PA2 to turn on or off respectively, the hybrid RF transceiver circuit 1c may provide higher overall efficiency than the hybrid RF transceiver circuit 1a.

Figure 4:
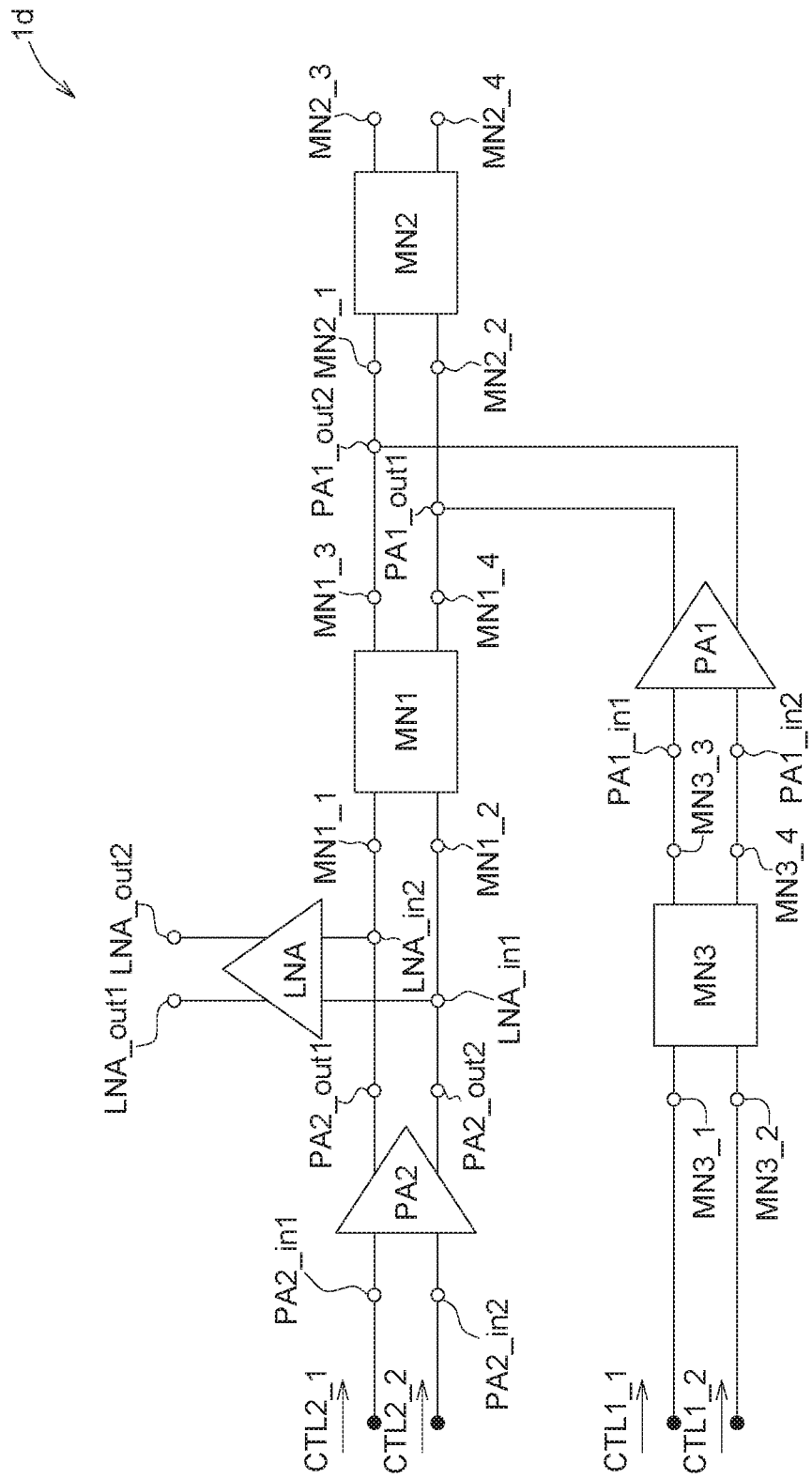
FIG. 4 shows a block diagram of a hybrid RF transceiver circuit according to the 4th embodiment of the present invention.

Referring to FIG. 4, FIG. 4 shows a block diagram of a hybrid RF transceiver circuit according to the 4th embodiment of the present invention. Hybrid RF transceiver circuit 1d is similar to the hybrid RF transceiver circuit 1c. The differences are that the hybrid RF transceiver circuit 1d further includes a third matching network MN3, and the first power amplifier PA1 receives the first RF input signal RFin1_1, RFin1_2 through the third matching network MN3.

The third matching network MN3 includes a first port MN3_1, MN3_2 and a second port MN3_3, MN3_4. The first port MN3_1, MN3_2 of the third matching network MN3 is used to receive the first RF input signal RFin2_1, RFin2_1. The second port MN3_3 of the third matching network MN3 is coupled to the input port PA1_in1, PA1_in2 of the first power amplifier PA1. Similarly, due to the first RF input signal RFin1_1, RFin1_2 and the second RF input signal RFin2_1, RFin2_2 may operate the first power amplifier PA1 and the second power amplifier PA2 to turn on or off respectively, the hybrid RF transceiver circuit 1d may provide higher overall efficiency than the hybrid RF transceiver circuit 1c.

Figure 5:
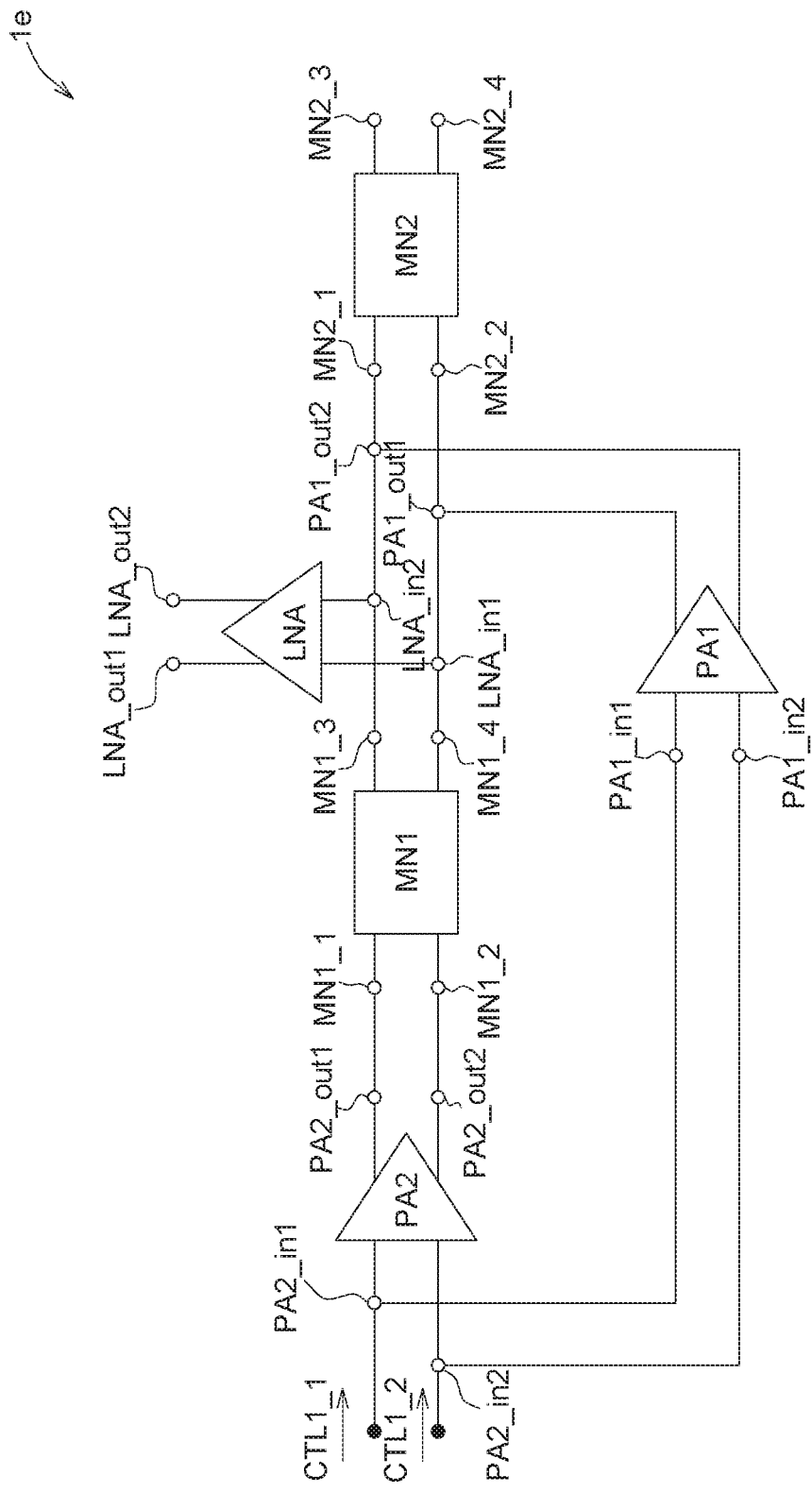
FIG. 5 shows a block diagram of a hybrid RF transceiver circuit according to the 5th embodiment of the present invention.

Referring to FIG. 5, FIG. 5 shows a block diagram of a hybrid RF transceiver circuit according to the 5th embodiment of the present invention. Hybrid RF transceiver circuit 1e is similar to the hybrid RF transceiver circuit 1a. The difference is that the low noise amplifier LNA of the hybrid RF transceiver circuit 1e is not coupled to the first matching network MN1 and the second power amplifier PA2, but is coupled to the first matching network MN1 and the second matching network MN2.

In this embodiment, the input port LNA_in1, LNA_in2 of the low noise amplifier LNA is coupled to the second port MN1_3, MN1_4 of the first matching network MN1 and the first port MN2_1, MN2_2 of the second matching network MN2. The output port LNA_out1, LNA_out2 of the low noise amplifier LNA is still used to be coupled to the receiver circuit.

Figure 6:
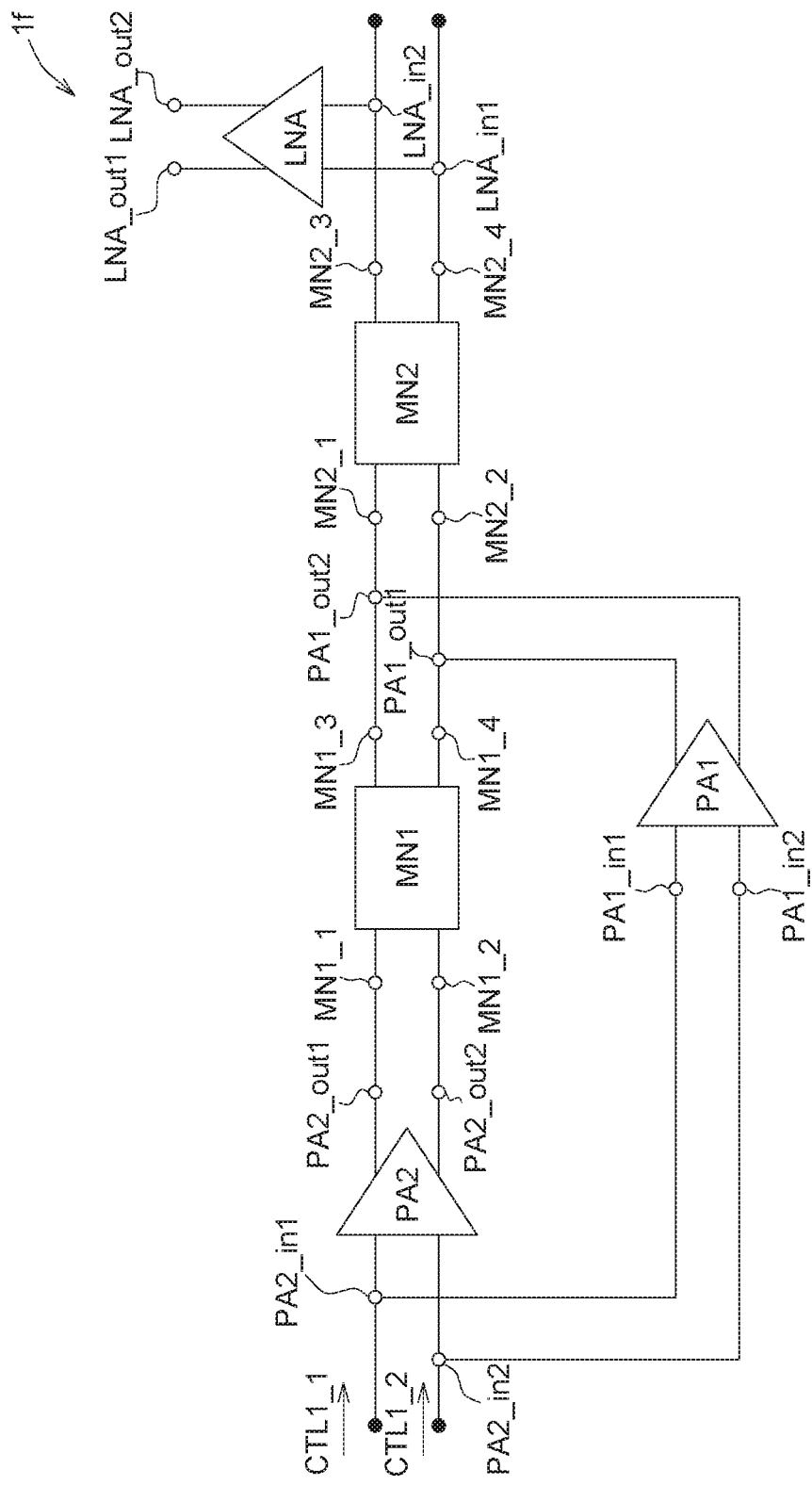
FIG. 6 shows a block diagram of a hybrid RF transceiver circuit according to the 6th embodiment of the present invention.

Referring to FIG. 6, FIG. 6 shows a block diagram of a hybrid RF transceiver circuit according to the 6th embodiment of the present invention. Hybrid RF transceiver circuit 1f is similar to the hybrid RF transceiver circuit 1a. The difference is that the low noise amplifier LNA of the hybrid RF transceiver circuit 1f is not coupled to the first matching network MN1 and the second power amplifier PA2, but is coupled to the second matching network MN2.

In this embodiment, the input port LNA_in1, LNA_in2 of the low noise amplifier LNA is coupled to the second port MN2_3, MN2_4 of the second matching network MN2. The output port LNA_out1, LNA_out2 of the low noise amplifier LNA is still used to be coupled to the receiver circuit.

More specifically, the difference between hybrid RF transceiver circuit 1a, hybrid RF transceiver circuit 1e and hybrid RF transceiver circuit 1f is that the position where the low noise amplifier LNA is coupled. That is, in different embodiments, the low noise amplifier LNA may be coupled to different positions according to the requirement of impedance matching.

Figure 7:
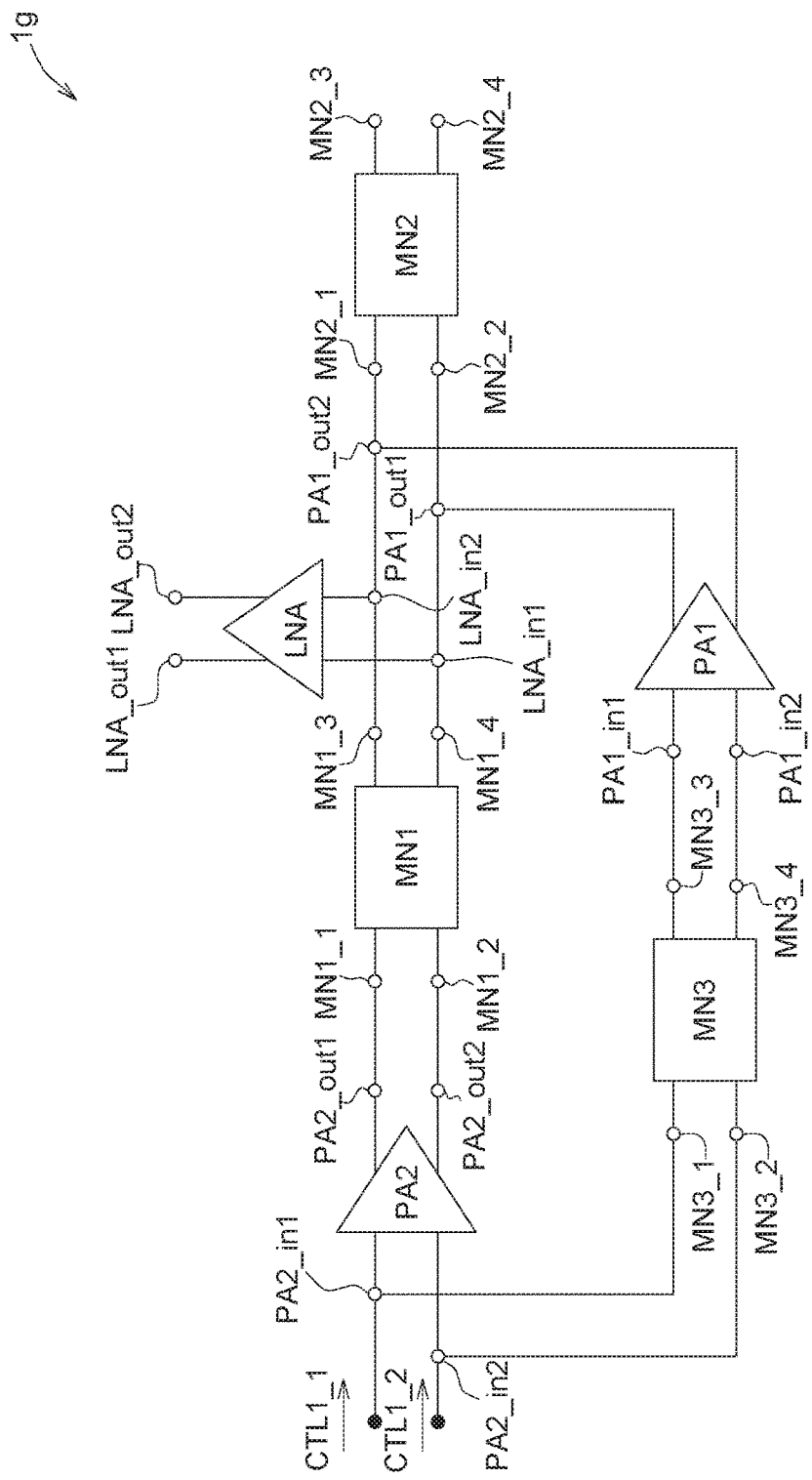
FIG. 7 shows a block diagram of a hybrid RF transceiver circuit according to the 7th embodiment of the present invention.
Figure 8:
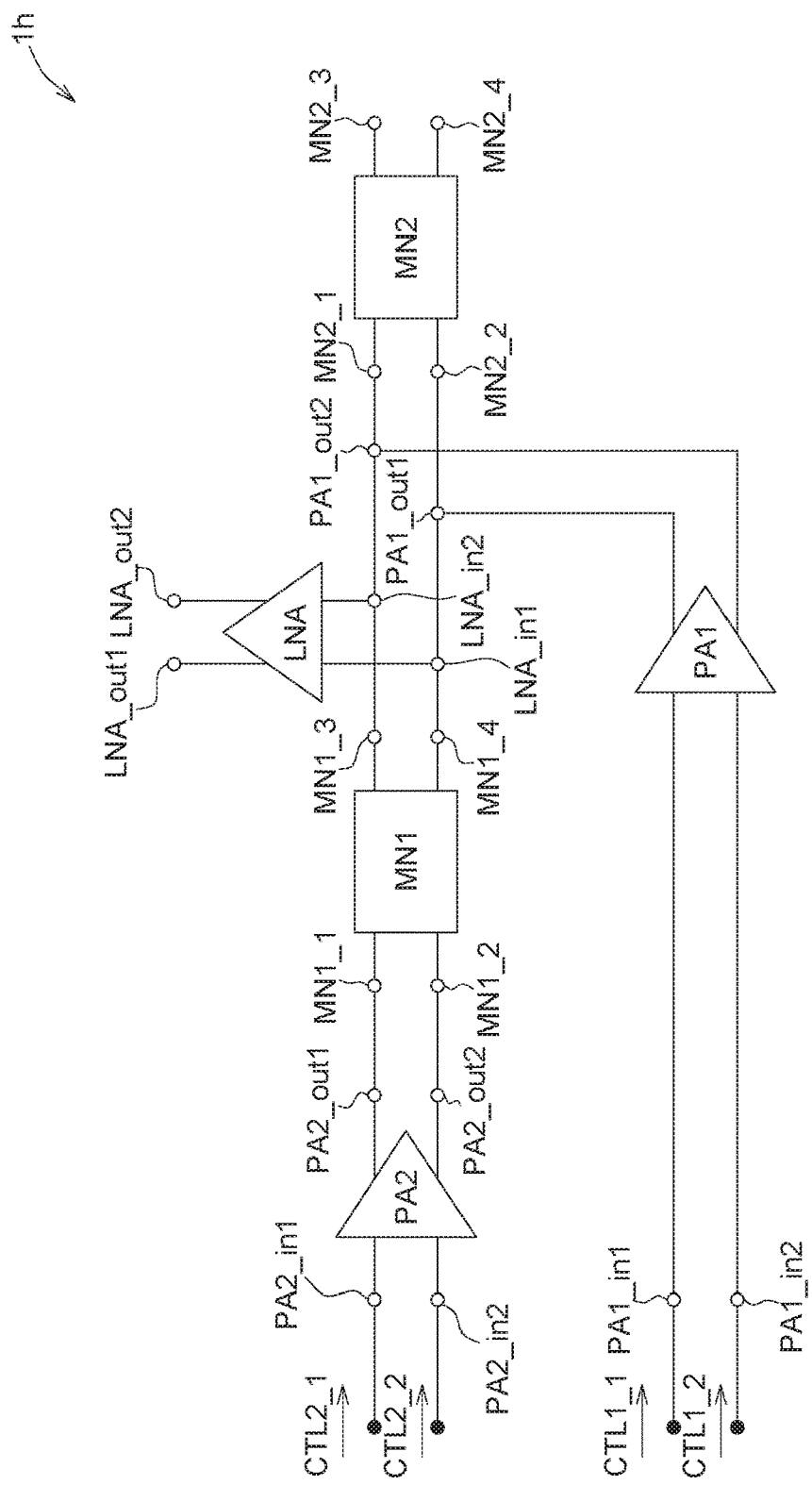
FIG. 8 shows a block diagram of a hybrid RF transceiver circuit according to the 8th embodiment of the present invention.
Figure 9:
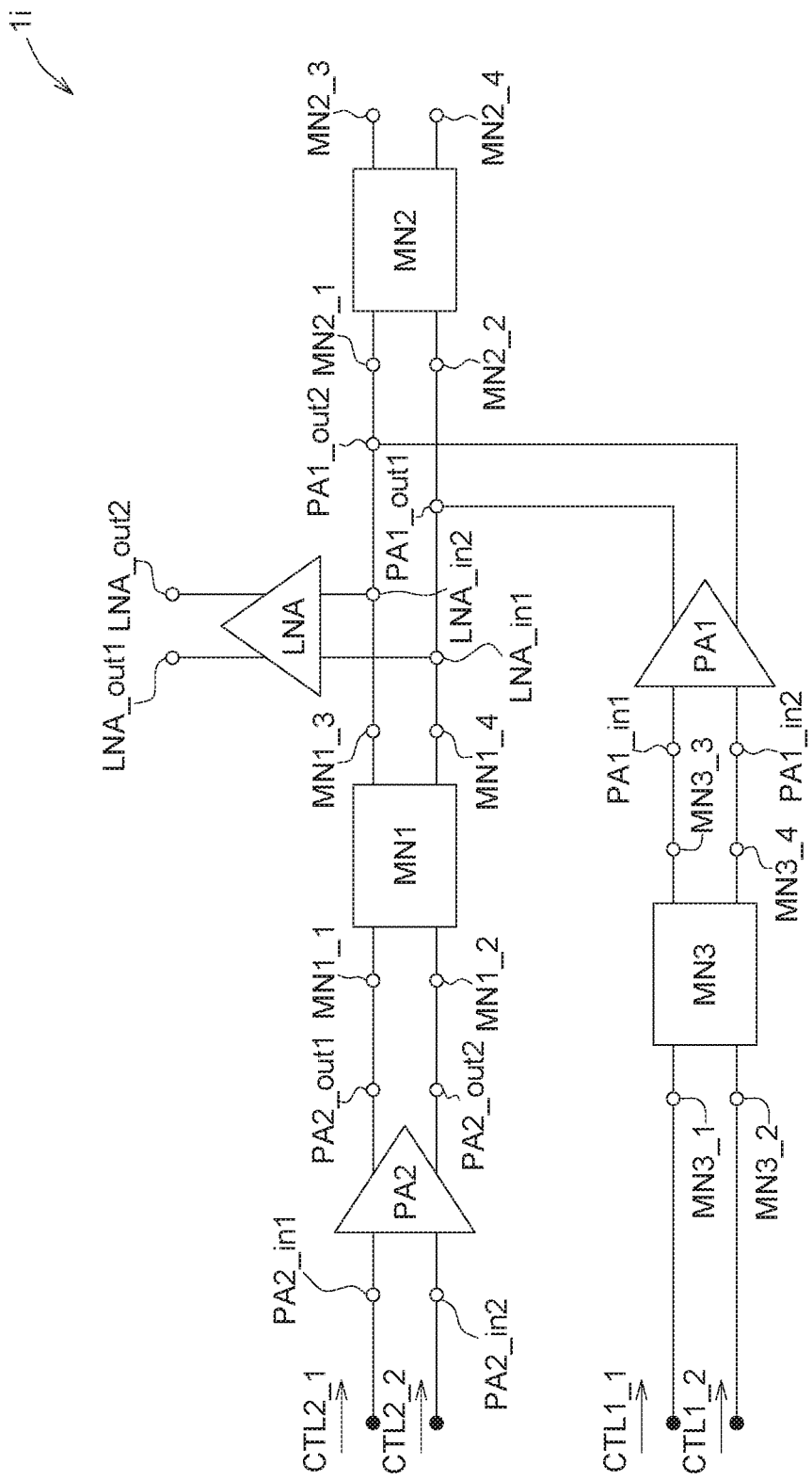
FIG. 9 shows a block diagram of a hybrid RF transceiver circuit according to the 9th embodiment of the present invention.

Referring to FIGS. 7~9, FIGS. 7~9 show a block diagram of a hybrid RF transceiver circuit according to the 7th~9th embodiment of the present invention. Hybrid RF transceiver circuit 1g, the hybrid RF transceiver circuit 1h and the hybrid RF transceiver circuit 1i are similar to the hybrid RF transceiver circuit 1b, the transceiver circuit 1c and the transceiver circuit 1d respectively. The difference is that the low noise amplifier LNA of the hybrid RF transceiver circuit 1g, the transceiver circuit 1h and the transceiver circuit 1i are not coupled to the first matching network MN1 and the second power amplifier PA2, but are coupled to the first matching network MN1 and the second matching network MN2 (i.e., similar to the transceiver circuit 1e shown in FIG. 5).

Figure 10:
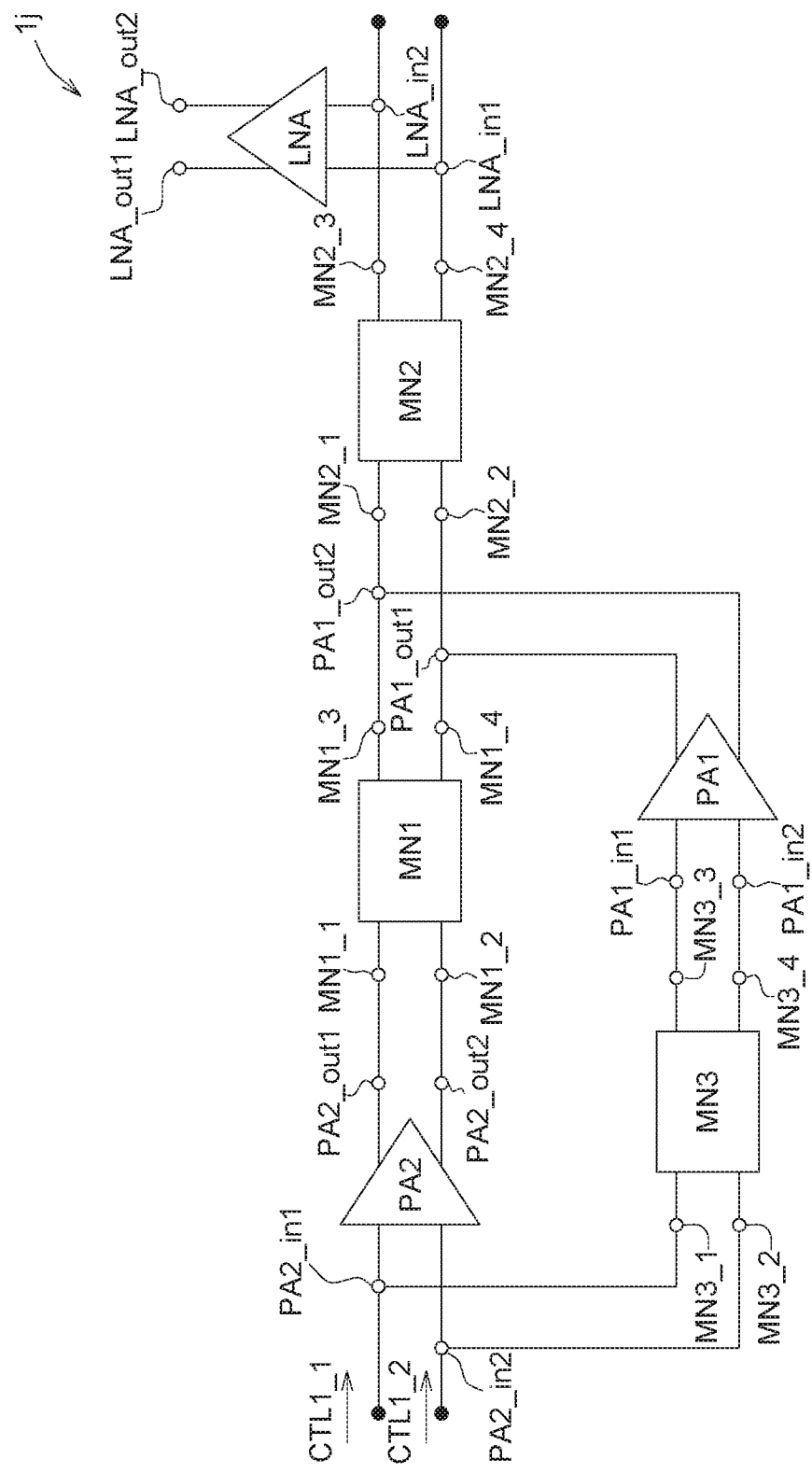
FIG. 10 shows a block diagram of a hybrid RF transceiver circuit according to the 10th embodiment of the present invention.
Figure 11:
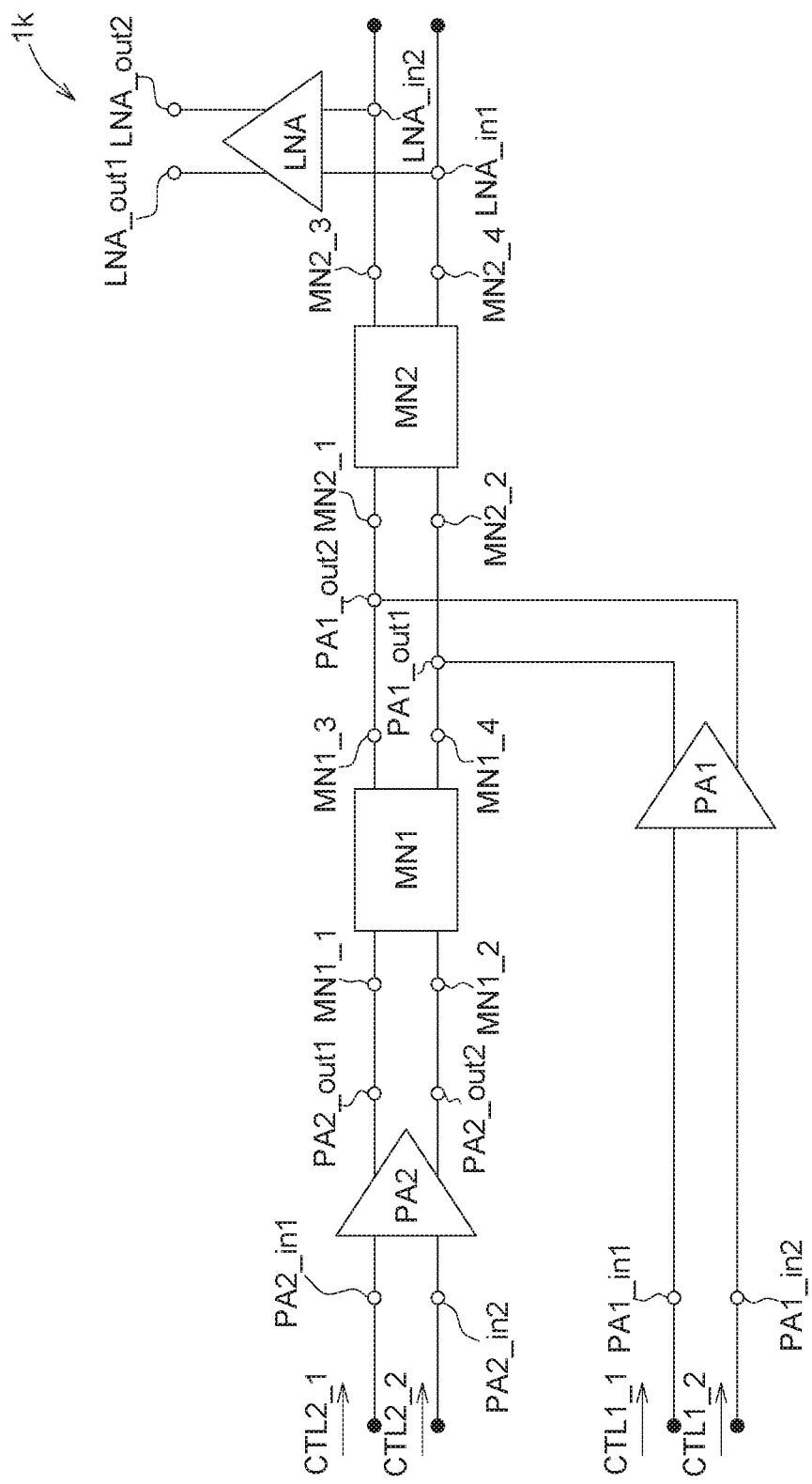
FIG. 11 shows a block diagram of a hybrid RF transceiver circuit according to the 11th embodiment of the present invention.
Figure 12:
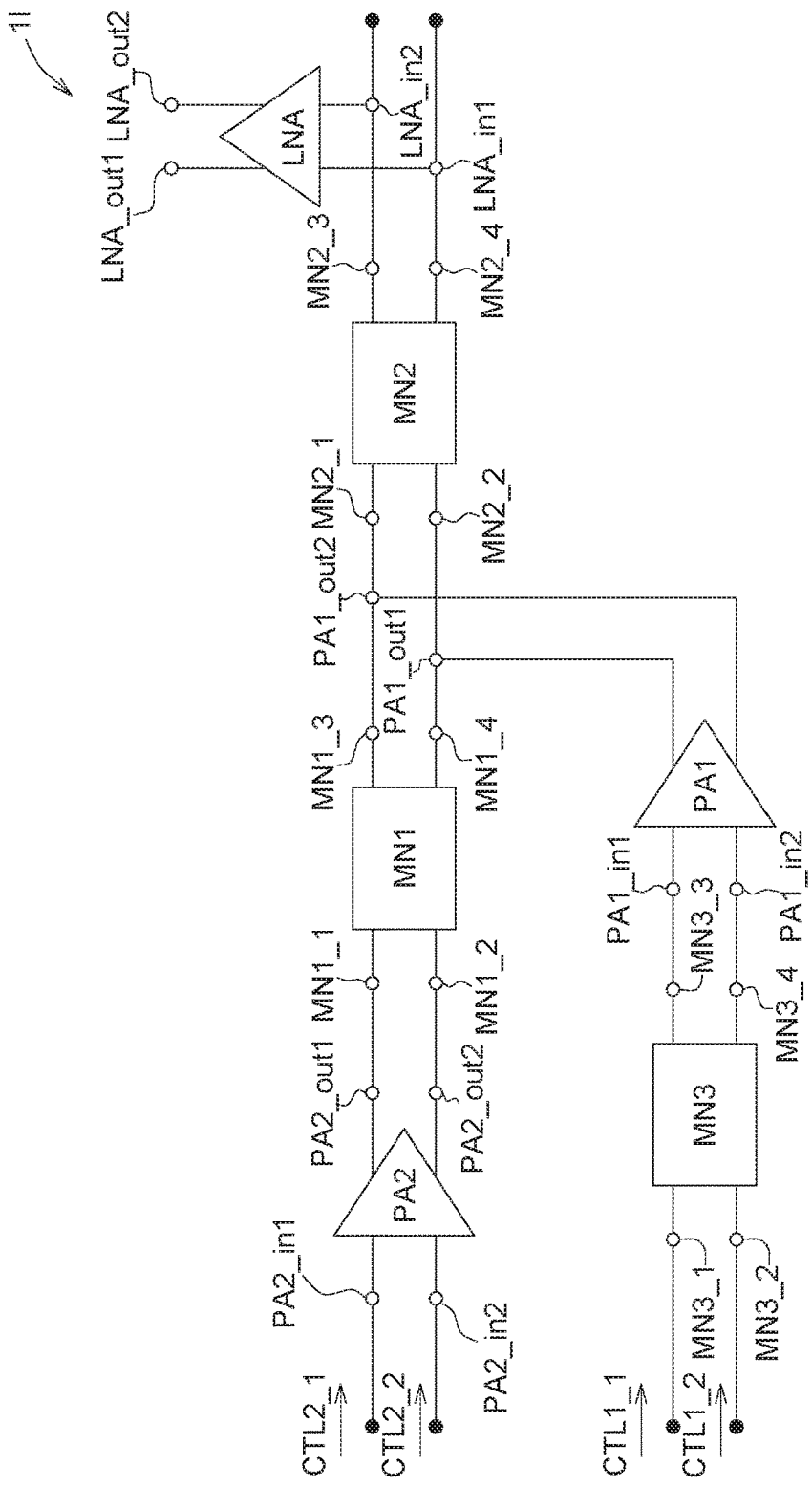
FIG. 12 shows a block diagram of a hybrid RF transceiver circuit according to the 12th embodiment of the present invention.

Referring to FIGS. 10~12, FIGS. 10~12 show a block diagram of a hybrid RF transceiver circuit according to the 10th~12th embodiment of the present invention. Hybrid RF transceiver circuit 1j, the hybrid RF transceiver circuit 1k and the hybrid RF transceiver circuit 1l are similar to the hybrid RF transceiver circuit 1b, the transceiver circuit 1c and the transceiver circuit 1d respectively. The difference is that the low noise amplifier LNA of the hybrid RF transceiver circuit 1j, the transceiver circuit 1k and the transceiver circuit 1l are not coupled to the first matching network MN1 and the second power amplifier PA2, but are coupled to the second matching network MN2 and the antenna (i.e., similar to the transceiver circuit 1f shown in FIG. 6).

In said embodiments above, the first matching network MN1, the second matching network MN2 and the third matching network MN3 are used to match the impedance between the circuit/device which coupled to the first port MN1_1, MN1_2, MN2_1, MN2_2, MN3_1, MN3_2 and the circuit/device which coupled to the second port MN1_3, MN1_4, MN2_3, MN2_4, MN3_3, MN3_4. Therefore, the first matching network MN1, the second matching network MN2 and the third matching network MN3 may be designed differently. The first matching network MN1, the second matching network MN2 and the third matching network MN3 may include one of a capacitor or an inductor or a balun or a combination of at least two of a capacitor, an inductor and a balun, and may be designed according to the requirement of impedance matching (e.g., 50 Ohm). Additionally, inductors may be tapped inductors or non-tapped inductors, and the baluns may be tapped baluns or non-tapped baluns. When the matching network includes a tapped inductor or a tapped balun, the tap of the inductor or the balun may be coupled to a DC voltage source to provide power for operating circuit(s). The embodiment of the matching network may be described with FIGS. 13~15 in below. It should be noted that the matching network refers to the first matching network MN1, the second matching network MN2 and the third matching network MN3.

Figure 13:
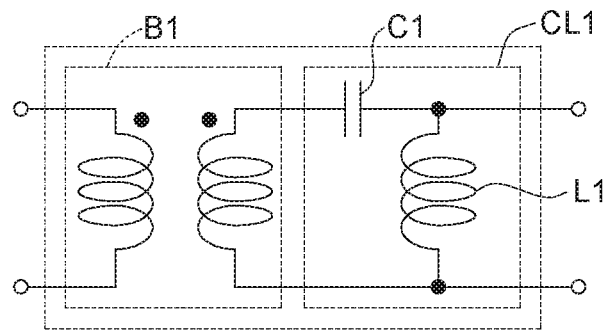
FIGS. 13~15 illustrate embodiments of a matching network.
Figure 14:
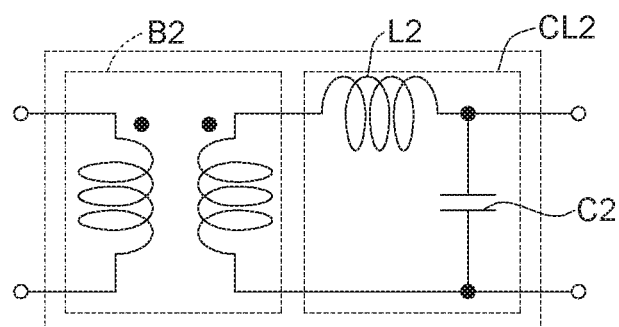
Figure 15:
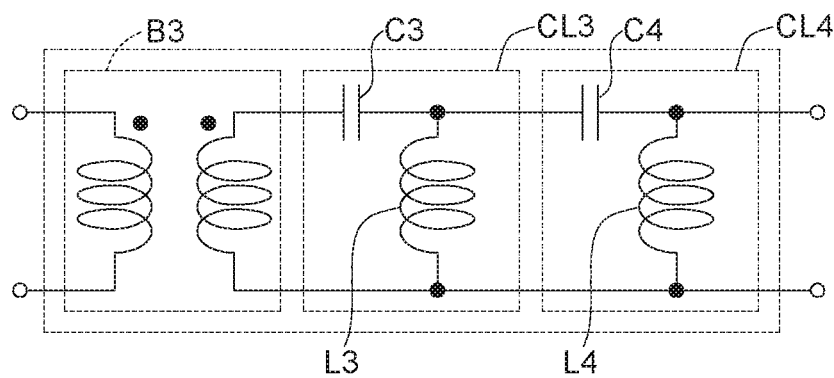

In FIG. 13, matching network includes a balun B1, a capacitor C1 and an inductor L1. The capacitor C1 and the inductor L1 are cascaded to form a CL L-section CL1, and the balun B1 and the CL L-section CL1 are cascaded to form the matching network. In FIG. 14, a balun B2 and a CL L-section CL2 are cascaded to form the matching network. The difference between the embodiments shown in FIG. 13 and FIG. 14 is that the position of the capacitor C1 and the inductor L1 in the CL L-section CL2 is exchanged. In FIG. 15, a balun and two CL L-section CL3, CL4 are cascaded to form the matching network. That is, the matching network may include more than one CL L-sections. The embodiments are only for example, the present invention is not limited by.

According to the embodiment of the present invention, the overall efficiency of the hybrid RF transceiver circuit may be improved by cooperating the first power amplifier PA1 with second power amplifier PA2. Moreover, with respectively operating the first power amplifier PA1 and the second power amplifier PA2 by different operating circuits may further improve the overall efficiency.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A hybrid RF transceiver circuit, comprising:
a first matching network, having a first port and a second port;
a second matching network, having a first port and a second port, the first port of the second matching network coupled to the second port of the first matching network, the second port of the second matching network configured to be coupled to an antenna;
a first power amplifier, having an input port and an output port, the output port of the first power amplifier coupled to the second port of the first matching network and the first port of the second matching network;

a second power amplifier, having an input port and an output port, the output port of the second power amplifier coupled to the first port of the first matching network; and a low noise amplifier, having an input port and an output port, the input port of the low noise amplifier coupled to the output port of the second power amplifier and the first port of the first matching network, the output port of the low noise amplifier configured to be coupled to a receiver circuit.

2. The hybrid RF transceiver circuit according to claim 1, further comprising:

a third matching network, having a first port and a second port, the second port of the third matching network coupled to the input port of the first power amplifier, wherein, the first port of the third matching network is used to receive a first RF input signal, the input port of the second power amplifier is used to receive a second RF input signal, and the first RF input signal is different from the second RF input signal.

3. The hybrid RF transceiver circuit according to claim 1, wherein, the input port of the second power amplifier is coupled to the input port of the first power amplifier, and the input port of the first power amplifier and the input port of the second power amplifier are used to receive a first RF input signal.

4. The hybrid RF transceiver circuit according to claim 1, further comprising:

a third matching network, having a first port and a second port, the first port of the third matching network coupled to the input port of the second power amplifier, the second port of the third matching network coupled to the input port of the first power amplifier, wherein, the first port of the third matching network and the input port of the second power amplifier are used to receive a first RF input signal.

5. The hybrid RF transceiver circuit according to claim 1, wherein, the input port of the first power amplifier is used to receive a first RF input signal, and the input port of the second power amplifier is used to receive a second RF input signal, and the first RF input signal is different from the RF input signal.

6. The hybrid RF transceiver circuit according to claim 1 wherein, the first matching network, or the second matching network comprise a capacitor or an inductor or a balun or a combination of at least two of a capacitor, an inductor and a balun.

7. The hybrid RF transceiver circuit according to claim 2 wherein, the first matching network, the second matching network or the third matching network comprises a capacitor or an inductor or a balun or a combination of at least two of a capacitor, an inductor and a balun.

8. The hybrid RF transceiver circuit according to claim 4 wherein, the first matching network, the second matching network or the third matching network comprises a capacitor or an inductor or a balun or a combination of at least two of a capacitor, an inductor and a balun.

9. A hybrid RF transceiver circuit, comprising:

a first matching network, having a first port and a second port;

a second matching network, having a first port and a second port, the first port of the second matching network coupled to the second port of the first matching network, the second port of the second matching network configured to be coupled to an antenna;

a first power amplifier, having an input port and an output port, the output port of the first power amplifier coupled to the second port of the first matching network and the first port of the second matching network;

a second power amplifier, having an input port and an output port, the output port of the second power amplifier coupled to the first port of the first matching network; and a low noise amplifier, having an input port and an output port, the input port of the low noise amplifier coupled to the second port of the first matching network and the first port of the second matching network, the output port of the low noise amplifier configured to be coupled to a receiver circuit.

10. The hybrid RF transceiver circuit according to claim 9, further comprising:

a third matching network, having a first port and a second port, the second port of the third matching network coupled to the input port of the first power amplifier, wherein, the first port of the third matching network is used to receive a first RF input signal, the input port of the second power amplifier is used to receive a second RF input signal, and the first RF input signal is different from the second RF input signal.

11. The hybrid RF transceiver circuit according to claim 9, wherein, the input port of the second power amplifier is coupled to the input port of the first power amplifier, and the input port of the first power amplifier and the input port of the second power amplifier are used to receive a first RF input signal.

12. The hybrid RF transceiver circuit according to claim 9, further comprising:

a third matching network, having a first port and a second port, the first port of the third matching network coupled to the input port of the second power amplifier, the second port of the third matching network coupled to the input port of the first power amplifier, wherein, the first port of the third matching network and the input port of the second power amplifier are used to receive a first RF input signal.

13. The hybrid RF transceiver circuit according to claim 9, wherein, the input port of the first power amplifier is used to receive a first RF input signal, and the input port of the second power amplifier is used to receive a second RF input signal, and the first RF input signal is different from the RF input signal.

14. The hybrid RF transceiver circuit according to claim 9 wherein, the first matching network, or the second matching network comprise a capacitor or an inductor or a balun or a combination of at least two of a capacitor, an inductor and a balun.

15. The hybrid RF transceiver circuit according to claim 10 wherein, the first matching network, the second matching network or the third matching network comprises a capacitor or an inductor or a balun or a combination of at least two of a capacitor, an inductor and a balun.

16. The hybrid RF transceiver circuit according to claim 12 wherein, the first matching network, the second matching network or the third matching network comprises a capacitor or an inductor or a balun or a combination of at least two of a capacitor, an inductor and a balun.

17. A hybrid RF transceiver circuit, comprising:

a first matching network, having a first port and a second port;

a second matching network, having a first port and a second port, the first port of the second matching network coupled to the second port of the first matching network, the second port of the second matching network configured to be coupled to an antenna;

a first power amplifier, having an input port and an output port, the output port of the first power amplifier coupled to the second port of the first matching network and the first port of the second matching network;

a second power amplifier, having an input port and an output port, the output port of the second power amplifier coupled to the first port of the first matching network; and a low noise amplifier, having an input port and an output port, the input port of the low noise amplifier coupled to the second port of the second matching network, the output port of the low noise amplifier configured to be coupled to a receiver circuit.

18. The hybrid RF transceiver circuit according to claim 17, further comprising:

a third matching network, having a first port and a second port, the second port of the third matching network coupled to the input port of the first power amplifier, wherein, the first port of the third matching network is used to receive a first RF input signal, the input port of the second power amplifier is used to receive a second RF input signal, and the first RF input signal is different from the second RF input signal.

19. The hybrid RF transceiver circuit according to claim 17, wherein, the input port of the second power amplifier is coupled to the input port of the first power amplifier, and the input port of the first power amplifier and the input port of the second power amplifier are used to receive a first RF input signal.

20. The hybrid RF transceiver circuit according to claim 17, further comprising:

a third matching network, having a first port and a second port, the first port of the third matching network coupled to the input port of the second power amplifier, the second port of the third matching network coupled to the input port of the first power amplifier, wherein, the first port of the third matching network and the input port of the second power amplifier are used to receive a first RF input signal.

21. The hybrid RF transceiver circuit according to claim 17, wherein, the input port of the first power amplifier is used to receive a first RF input signal, and the input port of the second power amplifier is used to receive a second RF input signal, and the first RF input signal is different from the RF input signal.

22. The hybrid RF transceiver circuit according to claim 17 wherein, the first matching network, or the second matching network comprise a capacitor or an inductor or a balun or a combination of at least two of a capacitor, an inductor and a balun.

23. The hybrid RF transceiver circuit according to claim 18 wherein, the first matching network, the second matching network or the third matching network comprises a capacitor or an inductor or a balun or a combination of at least two of a capacitor, an inductor and a balun.

24. The hybrid RF transceiver circuit according to claim 20 wherein, the first matching network, the second matching network or the third matching network comprises a capacitor or an inductor or a balun or a combination of at least two of a capacitor, an inductor and a balun.

* * * * *